United States Patent [19]

Nelson

[11] Patent Number: 5,128,553
[45] Date of Patent: Jul. 7, 1992

[54] LATERAL PNP TURN-OFF DRIVE CIRCUIT

[75] Inventor: Carl T. Nelson, San Jose, Calif.

[73] Assignee: Linear Technology Corporation, Milpitas, Calif.

[21] Appl. No.: 542,322

[22] Filed: Jun. 22, 1990

[51] Int. Cl.[5] .......................... H02K 1/12; H03K 3/01
[52] U.S. Cl. .................................. 307/253; 307/255; 307/296.1; 307/300
[58] Field of Search ............... 307/300, 253, 254, 255, 307/263, 296.1

[56] References Cited

U.S. PATENT DOCUMENTS

| | | | |
|---|---|---|---|
| 3,766,414 | 10/1973 | Blackburn et al. | 307/297 |
| 3,784,844 | 1/1974 | McGrogan, Jr. | 307/270 |
| 3,825,774 | 7/1974 | Van Kessel et al. | 307/260 |
| 4,006,370 | 2/1977 | Erler | 307/300 |
| 4,564,769 | 1/1986 | Melamed | 307/253 |
| 4,588,904 | 5/1986 | Glogolja | 307/300 |
| 4,642,483 | 2/1987 | Tomita | 307/300 |
| 4,644,186 | 2/1987 | Sivasothy et al. | 307/300 |
| 4,777,387 | 10/1988 | Collins | 307/270 |
| 4,847,520 | 7/1989 | O'Neill et al. | 307/296.1 |

OTHER PUBLICATIONS

"Inductor and Emitter Follower Remove Stored Charge To Turn Off 4 A in 20 ns," Erick Burwen; Electronic Design 19, Sep. 13, 1979; p. 154.

"Turn Off Circuit," D. E. Norton, IBM Technical Disclosure Bulletin, vol. 7, No. 6, Nov. 1064; p. 428.

Primary Examiner—Stanley D. Miller
Assistant Examiner—Sinh N. Tran
Attorney, Agent, or Firm—Mark D. Rowland

[57] ABSTRACT

An integrated circuit is provided which uses a single drive signal for turning a PNP switching transistor "on" and "off." An NPN transistor provides reverse drive current to the PNP transistor's base. When the drive signal is present, the PNP switching transistor is turned "on" and is driven into saturation. The drive signal during this period also charges an integrated capacitor coupled to the base of the NPN transistor. The drive signal then is removed to turn the PNP transistor "off." Removal of the drive signal also causes the voltage developed across the capacitor to drive the base of the NPN transistor. This, in turn, causes the NPN transistor to drive the base of the PNP transistor with a reverse drive current, thus speeding up the switching of the PNP transistor from the conducting state to the non-conducting state.

19 Claims, 3 Drawing Sheets

LATERAL PNP TURN-OFF DRIVE CIRCUIT

BACKGROUND OF THE INVENTION

The present invention relates to a circuit for controlling the "on" and "off" operation of a PNP transistor. More particularly, the present invention relates to a circuit for reducing the delay in the transition time of a PNP transistor caused by stored charge in the transistor's base as the transistor changes from a conducting state to a non-conducting state.

PNP transistors are often employed as switching elements in integrated switching regulator circuits. Typically, a PNP transistor used in this fashion has its emitter connected to the positive supply voltage. The transistor is controllably cycled "on" and "off" to regulate the flow of current between its emitter and collector by intermittently supplying a forward biasing or drive current to the transistor. The transistor is turned "on" by a base drive current, which typically drives the transistor into saturation. The transistor is turned "off" by removing the base drive current.

A problem, however, is that an amount of charge is stored in the PNP transistor's base when the transistor is turned "on". This base charge causes a delay in turning the transistor "off" because the stored base charge causes the base-emitter junction of the transistor to remain forward biased for a period of time following the removal of the base drive current. This delay in turning the transistor "off" may be several microseconds long, particularly if the transistor had been driven into saturation as typically occurs in a switching regulator. This delay limits the switching speed of the PNP transistor and, as a result, the efficiency of the circuit.

The time required to turn a switching PNP transistor "off" may be reduced by applying a reverse drive current to the base of the transistor to discharge the stored base charge. The greater the reverse drive current, the faster the base charge will be discharged and the faster the transistor will turn "off." To drive the PNP transistor quickly into a non-conducting state, the reverse drive current must be able to drive the base voltage of the PNP transistor close to the level of the voltage at its emitter.

A circuit for decreasing the switching time of a PNP transistor is shown in O'Neill and Nelson U.S. Pat. No. 4,487,520. The present invention provides alternative circuits for generating a reverse drive current to speed up the switching speed of a PNP transistor from the "on" state to the "off" state.

SUMMARY OF THE INVENTION

It is an object of the invention to provide a circuit for generating a reverse drive current for an integrated circuit PNP transistor in order to reduce the time it takes for the transistor to switch from the conducting state to the non-conducting state, which circuit does not require two separate drive signals for turning the transistor "on" and "off."

This and other objects of the invention are accomplished by an integrated circuit which uses a single drive signal for turning a PNP switching transistor "on" and "off." An NPN transistor provides reverse drive current to the PNP transistor's base. When the drive signal is present, the PNP switching transistor is turned "on" and is driven into saturation. The drive signal during this period also charges an integrated capacitor coupled to the base of the NPN transistor. The drive signal then is removed to turn the PNP transistor "off." Removal of the drive signal also causes the voltage developed across the capacitor to drive the base of the NPN transistor. This, in turn, causes the NPN transistor to drive the base of the PNP transistor with a reverse drive current, thus speeding up the switching of the PNP transistor from the conducting state to the non-conducting state.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
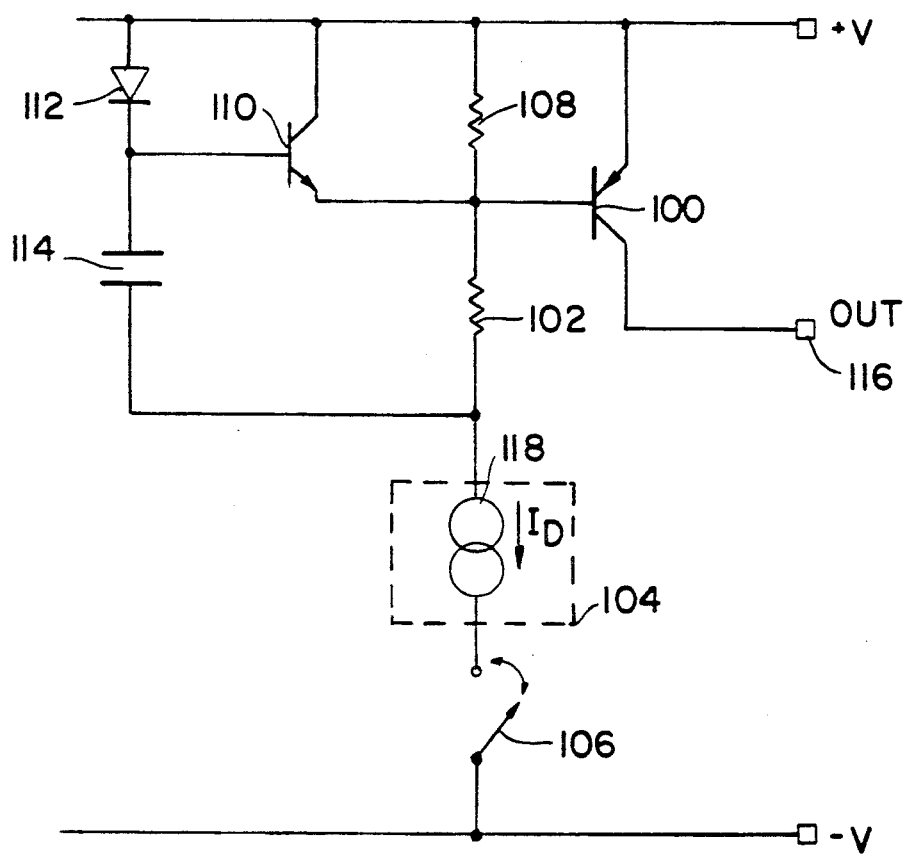
FIG. 1 is a schematic diagram of a first exemplary embodiment of the circuit of the present invention.

Referring to FIG. 1, transistor 100 is a conventional integrated circuit PNP transistor. The emitter of transistor 100 is connected to voltage supply V+, and the collector of transistor 100 is connected to a terminal 116. The base of transistor 100 is connected through resistor 102 to a conventional drive circuit 104. Drive circuit 104 may include a current source 118 as shown in FIG. 1, or it may comprise other conventional circuitry for providing a drive signal for PNP transistor 100. Drive circuit 104 in any event enables a forward drive current $I_D$ in PNP transistor 100 to be conducted on an intermittent basis through resistor 102, such that PNP transistor 100 is turned "on" and driven into a conducting state for predetermined periods of time. In this manner, a controlled flow of switched current may be provided to circuitry connected to terminal 116. For instance, the switched current may be utilized by other circuitry, not shown in FIG. 1, implementing a switching voltage regulator.

A drive signal ($I_D$) is provided by drive circuit 104, and PNP transistor 100 is switched "on", when switch 106 is closed. Switch 106 may be any conventional circuitry, such as a transistor, for passing or blocking drive signal $I_D$. Alternatively, switch 106 may be connected to turn drive circuit 104 "on" or "off." One example of circuitry which may be used to implement drive circuit 104 and switch 106 is shown in the aforementioned U.S. Pat. No. 4,847,520. (In FIG. 2 of the '520 patent, an NPN transistor 214 acts as a switch to cause a current source 122B functioning to switch a drive signal "on" and "off" in response to a signal from an oscillator 202 and associated circuitry.)

Also coupled to drive circuit 104 is one end of a capacitor 114. The other end of capacitor 114 is coupled to V+ through a rectifier junction 112 (e.g., a diode). When switch 106 is closed (and PNP transistor is "on"), current is conducted through diode 112 and capacitor 114 so that capacitor 114 is charged to a voltage equal to $(I_D)(R^{102})$.

The base of an NPN transistor 110 is connected to the node defined by the junction of the cathode of diode 112 and one terminal of capacitor 114 as shown in FIG.

1. The collector of NPN transistor 110 is connected to V+, and the emitter of NPN transistor 110 is connected to the base of PNP transistor 100. When switch 106 opens, and drive signal $I_D$ ceases, the voltage across capacitor 114 will continue, at least initially, to appear across the base-emitter of NPN transistor 110 and resistor 102. This will generate a current, $I^{Rl}$, which now flows into the base of NPN transistor 110. This current drives NPN transistor 110 hard into saturation, with the base voltage capable of being positive with respect to the supply voltage V+. As a consequence, NPN transistor 110 delivers a high reverse base current to PNP transistor 100, resulting in a rapid discharging of base charge in, and fast turn-off of, PNP transistor 100. A resistor 108 also may be coupled between V+ and the base of PNP transistor 100. This resistor may be added to ensure that PNP transistor 100 remains "off" after capacitor 114 has discharged and no longer provides NPN transistor 110 with base drive.

Figure 2:
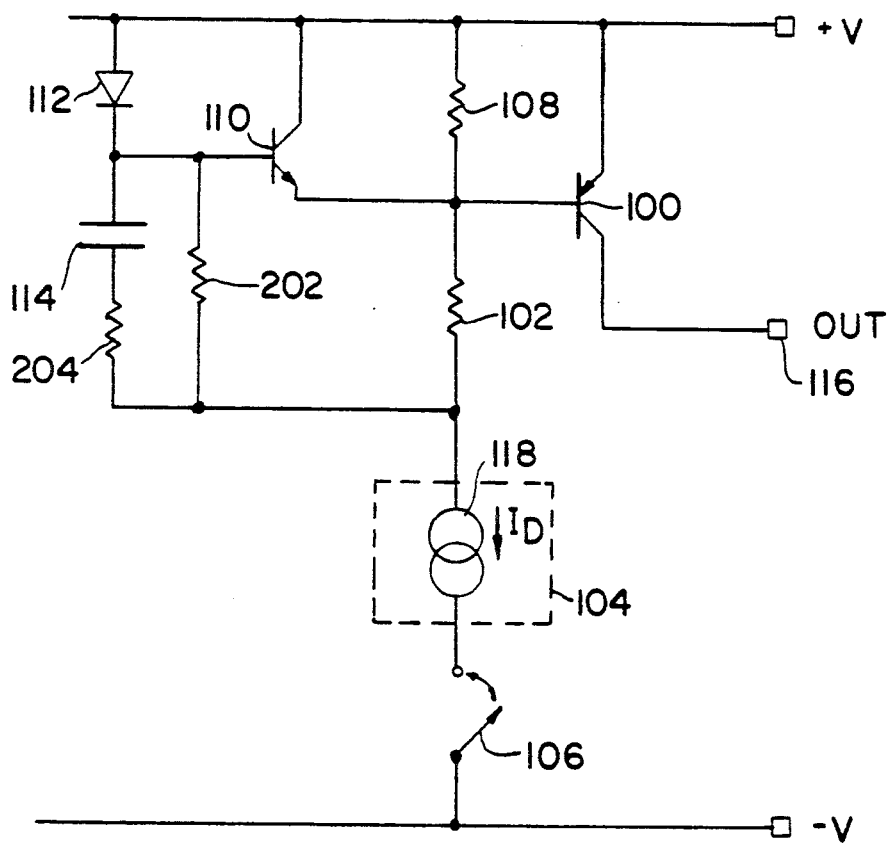
FIG. 2 is a schematic diagram of a second exemplary embodiment of the circuit of the present invention.

Referring to FIG. 2, a second exemplary embodiment of the invention will now be described. The circuitry of FIG. 2 is the same as that of FIG. 1, except that a resistor 204 has been added in series between capacitor 114 and drive circuit 104 and resistor 202 has been added in parallel with the series combination of capacitor 114 and resistor 204. Resistor 204 can be added to extend the "on" time of NPN transistor 110. Resistor 204 functions to extend the time constant of the reverse drive cycle from $(R^{102})(C^{114})$ seconds to $(R^{102}+R^{204})(C^{114})$ seconds (where $R^{102}$ and $R^{204}$ are the respective resistances of resistors 102 and 104, and $C^{114}$ is the capacitance of capacitor 114), without affecting the magnitude of the forward drive to PNP transistor 100. Resistor 204 also prevents capacitor 114 from slowing the rise time of forward drive to PNP transistor 100.

Resistor 202 may be used to ensure that diode 112 has continuous forward current during extended "on" periods of PNP transistor 100. If the "on" time of drive signal ID is extended, thus extending the "on" time of PNP transistor 100, capacitor 114 might charge up and the current through diode 112 might fall close to zero. Resistor 202 ensures that there is always a minimum current flow through diode 112, irrespective of the current flow through capacitor 114. This, in turn, ensures that the voltage at the base of NPN transistor 110 is kept low enough so as to prevent NPN transistor 110 from turning "on" and diverting PNP transistor 100 base drive during PNP transistor 100 "on" time.

Figure 3:
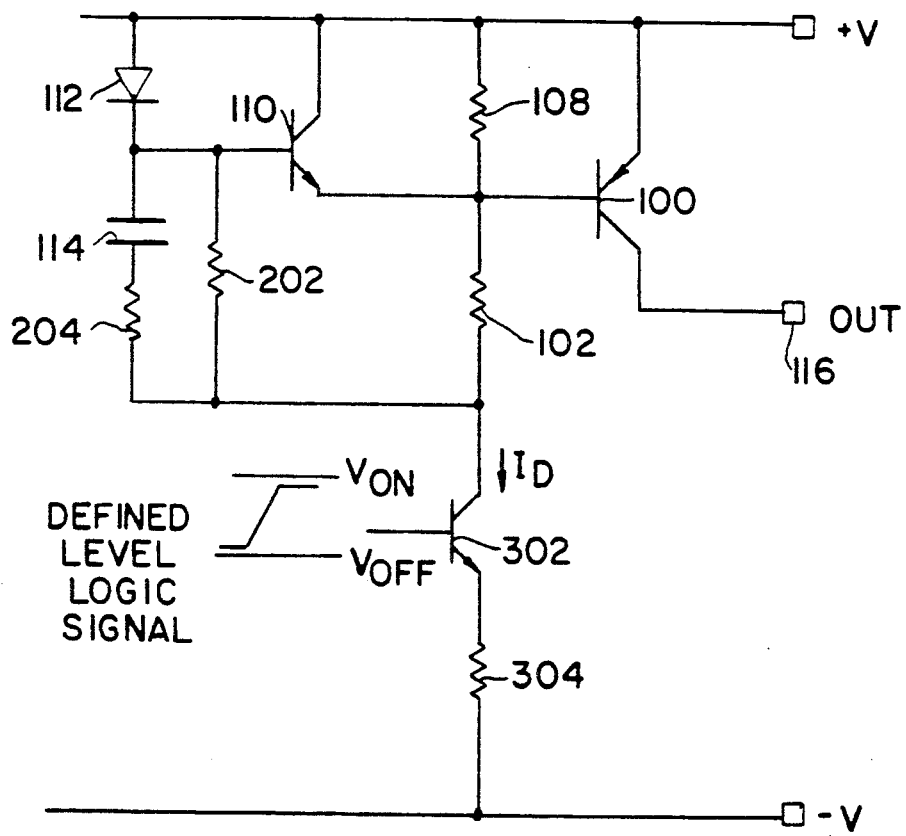
FIG. 3 is a schematic diagram of the circuit of FIG. 2 showing an exemplary embodiment of the current source 118 and switch 106.

Referring to FIG. 3, further exemplary circuitry for implementing current source 118 and switch 106 of FIGS. 1 and 2 are shown. (Applicant has already explained that the reader may refer to U.S. Pat. No. 4,847,520 for examples of drive circuit 104 and switch 106.) NPN transistor 302 acts as both switch 106 and, along with resistor 304, as current source 118. A defined level logic signal is provided to the base of NPN transistor 302 by other circuitry of drive circuit 104 to control the switching of NPN transistor 302 and (with resistor 304) the magnitude of current $I_D$ conducted by NPN transistor 302 when it is switched on.

Thus a circuit for providing a reverse drive current to the base of a switching PNP transistor in an integrated circuit, to increase the turn-off switching speed of the transistor, has been described. Although preferred embodiments of the invention have been disclosed with various components connected to other components, persons of ordinary skill in the art will appreciate that it may not be necessary for such connections to be direct and additional components may be interconnected between the shown connected components without departing from the spirit of the invention as shown. Further, component and other circuitry values and parameters may be modified. Persons skilled in the art will appreciate also that the present invention can be practiced by other than the described embodiments, which are presented for purposes of illustration and not of limitation, and the present invention is limited only by the claims which follow.

What is claimed is:

1. In a monolithic integrated circuit including positive and negative supply terminals, and including a PNP transistor having a collector, an emitter connected to conduct current from the positive supply terminal to the collector, and a base, a circuit for reducing the time required for the PNP transistor to switch from a saturated state to a non-saturated state, comprising:

means, coupled to the negative supply terminal, for intermittently conducting a base drive current between the base of the PNP transistor and the negative supply terminal to turn the PNP transistor on and off, said base drive current being sufficient to drive the PNP transistor into saturation;

an NPN transistor having a collector emitter circuit coupled between the positive supply terminal and a base of the PNP transistor, and connected to conduct a reverse drive current to the base of the PNP transistor;

a rectifying junction coupled between the positive supply terminal and the base of said NPN transistor, said rectifying junction being adapted to conduct a current from the positive supply terminal to said NPN transistor;

a capacitor coupled between the base of said NPN transistor and said intermittent drive means, whereby said capacitor is charged when the PNP transistor is turned on, and is discharged into the base of said NPN transistor when the PNP transistor is turned off by supplying a reverse drive voltage pulse which exceeds the voltage at the positive supply terminal such that said NPN transistor is driven into saturation; and a resistor coupled between the base of said PNP transistor and said base drive means for adjusting the voltage to which said capacitor is charged.

2. The circuit of claim 1, further including means coupled in series with said capacitor between said intermittent drive means and the base of said NPN transistor, for extending the duration of the reverse drive voltage.

3. The circuit of claim 2, wherein said duration extending means comprises a resistor coupled in series with said capacitor between said intermittent drive means and the base of said NPN transistor.

4. The circuit of claim 1, further including means coupled between said intermittent drive means and the base of said NPN transistor, for ensuring a minimum forward current through said rectifying junction while said PNP transistor is turned on to prevent said NPN transistor from concurrently turning on.

5. The circuit of claim 4, wherein said ensuring means comprises a resistor coupled between said intermittent drive means and the base of said NPN transistor.

6. In a circuit including a supply terminal and a PNP transistor having a collector, an emitter connected to conduct current from the supply terminal to the collector, and a base, a circuit for reducing the time required for the PNP transistor to switch from a saturated state to a non-saturated state, comprising:

a resistor coupled between the base of the PNP transistor and a first node;

means, coupled to the first node, for intermittently conducting current form the first node such that said resistor responsively conducts an intermittent base drive current between the base of the PNP transistor and said first node to turn the PNP transistor on and off, said base drive current being sufficient to drive the PNP transistor into saturation;

an NPN transistor having a base coupled to a second node and a collector-emitter circuit coupled between the supply terminal and the base of the PNP transistor;

a rectifying junction coupled between the supply terminal and said second node; and a capacitor coupled between said first and second nodes, whereby conduction of base drive current by said resistor generates a voltage across said capacitor which causes a charging current to be conducted by said capacitor between said first and second nodes, and removal of said base drive current discharges said capacitor into the base of said NPN transistor such that said capacitor supplies a voltage pulse to the base of the NPN transistor which exceeds the voltage at the supply terminal, causing said NPN transistor to be driven into saturation and to conduct reverse drive current to the base of the PNP transistor.

7. The circuit of claim 6, further including means coupled in series with said capacitor between the first and second nodes for extending the duration of the reverse drive voltage.

8. The circuit of claim 7, wherein said duration extending means comprises a resistor coupled in series with said capacitor between said first and second nodes.

9. The circuit of claim 6, further including means coupled between said first and second nodes for ensuring a minimum forward current through said rectifying junction while said PNP transistor is turned on to prevent said NPN transistor from concurrently turning on.

10. The circuit of claim 9, wherein said ensuring means comprises a resistor coupled in parallel with said capacitor between said first and second nodes.

11. The circuit of claim 8, further including a resistor, coupled in parallel with said series-coupled capacitor and resistor between said first and second nodes, for ensuring a minimum forward current through said rectifying junction while said PNP transistor is turned on to prevent said NPN transistor from concurrently turning on.

12. In a monolithic integrated circuit including first and second supply terminals, and including a PNP transistor having a collector, an emitter connected to conduct current form the first supply terminal to the collector, and a base, a circuit connected to the base of said PNP transistor for turning the PNP transistor on and off and for increasing the turn-off switching speed of the PNP transistor, comprising:

a switched current source, for intermittently conducting drive signal current from a fist node to the second supply terminal;

an NPN transistor, for conducting a reverse drive current to the base of the PNP transistor, having a base, a collector connected to the first supply terminal, and an emitter connected to the base of the PNP transistor;

a diode with its anode connected to the first supply terminal and with its cathode connected to a second node, said second node being connected to the base of the NPN transistor;

a capacitor connected between the first and second nodes;

a first resistor connected between the base of the PNP transistor and the first node; and a second resistor connected between the first supply terminal and the base of the PNP transistor, whereby conduction of drive signal current by said switched current source turns on said PNP transistor and generates a voltage across said capacitor which causes a charging current to be conducted by said capacitor, and whereby switching off of said drive signal current discharges said capacitor into the base of said NPN transistor such that said capacitor supplies a voltage pulse to the base of the NPN transistor which exceeds the voltage at the first supply terminal, causing said NPN transistor to be driven into saturation and to conduct reverse drive current to the base of the PNP transistor.

13. The circuit of claim 12 further comprising a third resistor connected between the first and second nodes.

14. The circuit of claim 12, wherein a third resistor is connected in series with the capacitor between the first and second nodes.

15. The circuit of claim 12 further comprising:

a third resistor connected between the first and second nodes; and a fourth resistor connected in series with the capacitor between the first and second nodes.

16. The circuit of claim 12 wherein the switched current source further comprises a second NPN transistor with its collector connected to the first node, its base connected to a logic signal line for controlling switching of the current source, and its emitter connected to one end of a resistor, the other end of the resistor being connected to the second supply terminal.

17. The circuit of claim 15 wherein the switched current source further comprises a second NPN transistor with its collector connected to the first node, its base connected to a logic signal line for controlling switching of the current source, and its emitter connected to one end of a resistor, the other end of the resistor being connected to the second supply terminal.

18. The circuit of claim 12, wherein the first and second supply terminals comprise respectively positive and negative supply terminals of the monolithic integrated circuit.

19. The circuit of claim 17, wherein the first and second supply terminals comprise respectively positive and negative supply terminals of the monolithic integrated circuit.

* * * * *